United States Patent
Gardner et al.

(10) Patent No.: US 9,466,662 B2
(45) Date of Patent: Oct. 11, 2016

(54) ENERGY STORAGE DEVICES FORMED WITH POROUS SILICON

(71) Applicant: Intel Corporation, Santa Clara, CA (US)

(72) Inventors: Donald S. Gardner, Los Altos, CA (US); Larry E. Mosley, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 13/730,308

(22) Filed: Dec. 28, 2012

(65) Prior Publication Data

US 2014/0183694 A1    Jul. 3, 2014

(51) Int. Cl.
  *H01L 21/02*    (2006.01)
  *H01L 49/02*    (2006.01)

(52) U.S. Cl.
  CPC ...................... *H01L 28/90* (2013.01)

(58) Field of Classification Search
  CPC ........................................ H01L 28/90
  USPC ........................................ 257/532
  See application file for complete search history.

(56) References Cited

U.S. PATENT DOCUMENTS

| | | | |
|---|---|---|---|
| 5,973,910 A | 10/1999 | Gardner | |
| 6,027,980 A | 2/2000 | Gardner | |
| 6,794,262 B2* | 9/2004 | Ning | H01L 23/5223 257/E21.009 |
| 7,741,188 B2 | 6/2010 | Dyer et al. | |
| 2004/0056324 A1 | 3/2004 | Ning et al. | |
| 2004/0108587 A1* | 6/2004 | Chudzik | H01L 23/50 257/700 |
| 2004/0131897 A1 | 7/2004 | Jenson et al. | |
| 2004/0195621 A1* | 10/2004 | Nasr | H01L 21/84 257/347 |
| 2007/0141256 A1* | 6/2007 | Liebau | C23C 16/0227 427/249.1 |
| 2008/0218940 A1* | 9/2008 | Singh | C01G 23/002 361/524 |
| 2009/0236691 A1* | 9/2009 | Dyer | H01L 21/84 257/532 |
| 2009/0266418 A1 | 10/2009 | Hu et al. | |
| 2011/0073827 A1 | 3/2011 | Rubloff et al. | |

FOREIGN PATENT DOCUMENTS

| | | |
|---|---|---|
| JP | 06-013547 | 1/1994 |
| KR | 10-2012-0036750 | 4/2012 |
| WO | WO-03/065422 | 8/2003 |

OTHER PUBLICATIONS

Lehmann et al., "A novel capacitor technology based on porous silicon", Thin Solid Films 276, pp. 138-142, 1996, Elsevier Science S. A.*

(Continued)

*Primary Examiner* — Andy Huynh
*Assistant Examiner* — Sitaramarao S Yechuri
(74) *Attorney, Agent, or Firm* — Blakely, Sokoloff, Taylor & Zafman LLP

(57) ABSTRACT

In one embodiment, an energy storage device (e.g., capacitor) may include a porous silicon layer formed within a substrate. The porous silicon layer includes pores with a mean pore diameter less than approximately 100 nanometers. A first conductive layer is formed on the porous silicon layer and a first dielectric layer is formed on the first conductive layer. A second conductive layer is formed on the first dielectric layer to form the capacitor.

20 Claims, 7 Drawing Sheets

(56) References Cited

OTHER PUBLICATIONS

Pan et al. "Layout optimizations for double patterning lithography", ASIC, 2009. ASICON '09. IEEE 8th International Conference, Oct. 20-23, 2009, Conference Location : Changsha, Hunan Page(s): 726-729 E-ISBN : 978-1-4244-3870-9 Print ISBN: 978-1-4244-3868-6, IEEE.*

*Wikipedia Mesoporous Material*, 2 pages, Oct. 24, 2012.

"International Search Report and the Written Opinion of the International Search ing Authority", for PCT/US2013/047187, mailed Aug. 28, 2013, 9 pages.

Banerjee, Parag , et al., "Nanotubular Metal-insulator-metal Capacitor Arrays for Energy Storage", *Nature Nanotechnology Letters*, 8 pages, Mar. 15, 2009.

Hochbaum, Allon I., et al., "Single Crystalline Mesoporous Silicon Nanowires", American Chemical Society, *Nano Letters*, vol. 9, No. 10, pp. 3550-3554, Sep. 1, 2009.

Kemell, Marianna , et al., "Si/Al2O3/ZnO:Al Capacitor Arrays Formed in Electrochemically Etched Porous Si by Atomic Layer Deposition", Science Direct, *Microelectronic Engineering 84*, 6 pages, Nov. 16, 2006.

Klootwijk, J.H. , et al., "MIM in 3D: Dream or Reality?", Science Direct, *Microelectronic Engineering 88*, 7 pages, Apr. 6, 2011.

Roozeboom, F. , et al., "High-value MOS Capacitor Arrays in Ultradeep Trenches in Silicon", Elsevier *Microelectronic Engineering 53*, 53 4 pages, 2000.

Schoning, M.J. , et al., "Novel Electrochemical Sensors with Structured and Porous Semiconductor/Insulator Capacitors", Elsevier, *Sensors and Actuators B 65*, 3 pages, 2000.

"International Preliminary Report on Patentability", for PCT/US2013/047187, mailed Jul. 9, 2015, 6 pages.

* cited by examiner

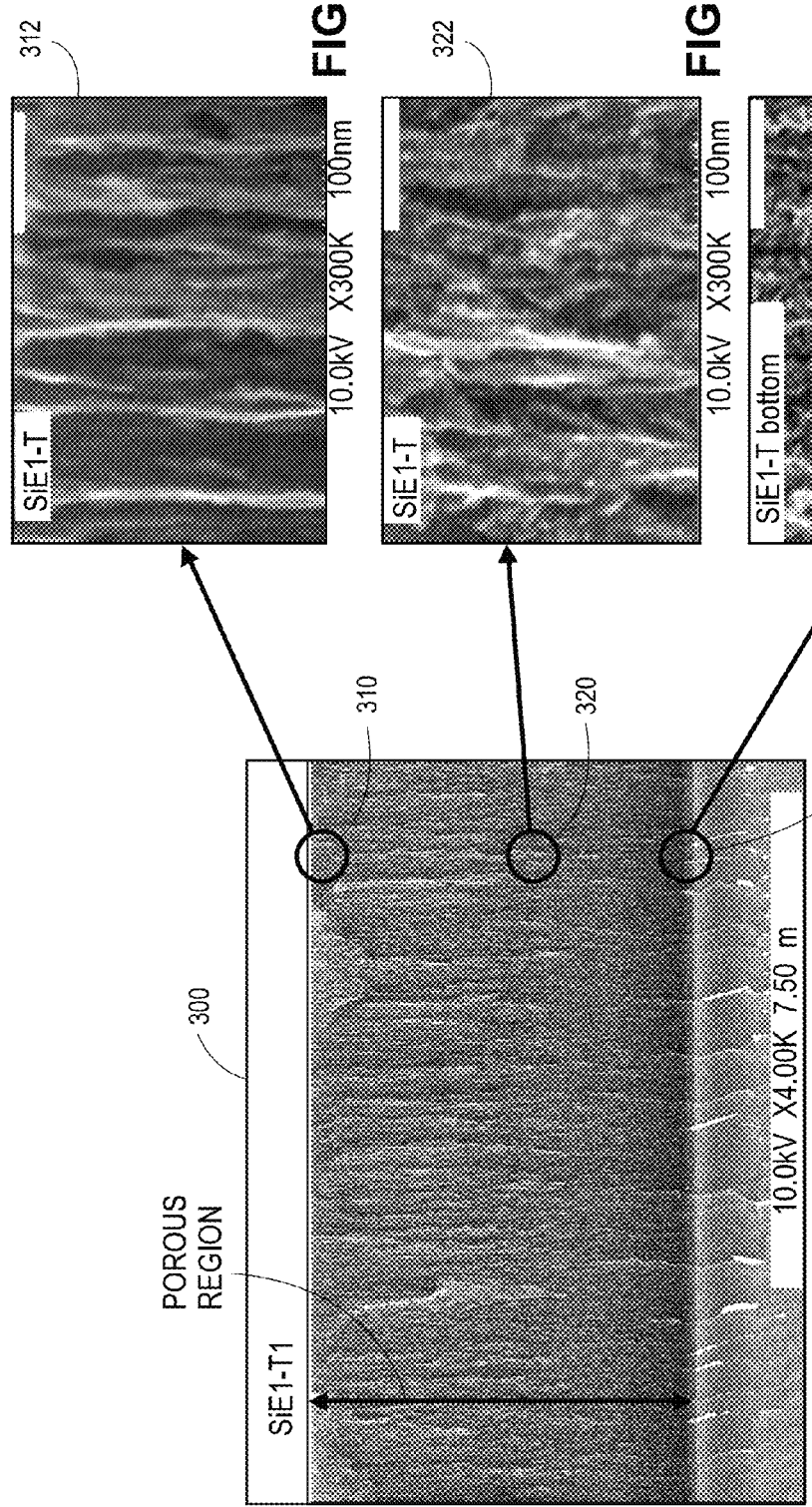

ENERGY STORAGE DEVICES FORMED WITH POROUS SILICON

TECHNICAL FIELD

The disclosed embodiments of the invention relate generally to energy storage devices including capacitors formed with electrochemically etched porous silicon.

BACKGROUND

Energy storage devices, including batteries and capacitors, are used extensively in electronic devices. In particular, capacitors are widely used for applications ranging from electrical circuitry and power delivery to voltage regulation and battery replacement. The need for on-chip power delivery is increasing with each generation of microprocessor technology. This need is increasing with the integration of on-chip voltage regulators for multicore microprocessors.

Currently capacitors are being formed using planar Metal Insulator Metal (MIM) structures embedded in the dielectric or by forming MOS capacitors in chip areas that do not have transistors using heavily doped silicon substrates. Also, another approach uses integrated trench capacitors. Another approach is making silicon capacitors using large 1.0 to 1.5 micron diameter circular openings with a 3.5 micron pitch that is patterned and dry etched in trenches using regular lithography and then filled using thermal oxide and low pressure chemical vapor deposition (LPCVD) nitride and LPCVD polysilicon for the second electrode. MOS capacitors have been previously formed in two micron deep electrochemically etched porous silicon structures with one micron mean pore diameters as well as 100 micron deep dry etched trench structures with one micron pore diameters. MIMIM structures have also been formed in one micron diameter pores.

BRIEF DESCRIPTION OF THE DRAWINGS

The disclosed embodiments will be better understood from a reading of the following detailed description, taken in conjunction with the accompanying figures in the drawings in which:

FIG. 3A illustrates a scanning electron microscope (SEM) image 300 showing a structure with tapered pore openings formed in tapered porous silicon according to an embodiment of the invention;

FIGS. 3B-3D illustrate SEM images 312, 322, and 332 showing magnified views of a different regions of the image 300 in porous silicon according to an embodiment of the invention;

Figure 1:
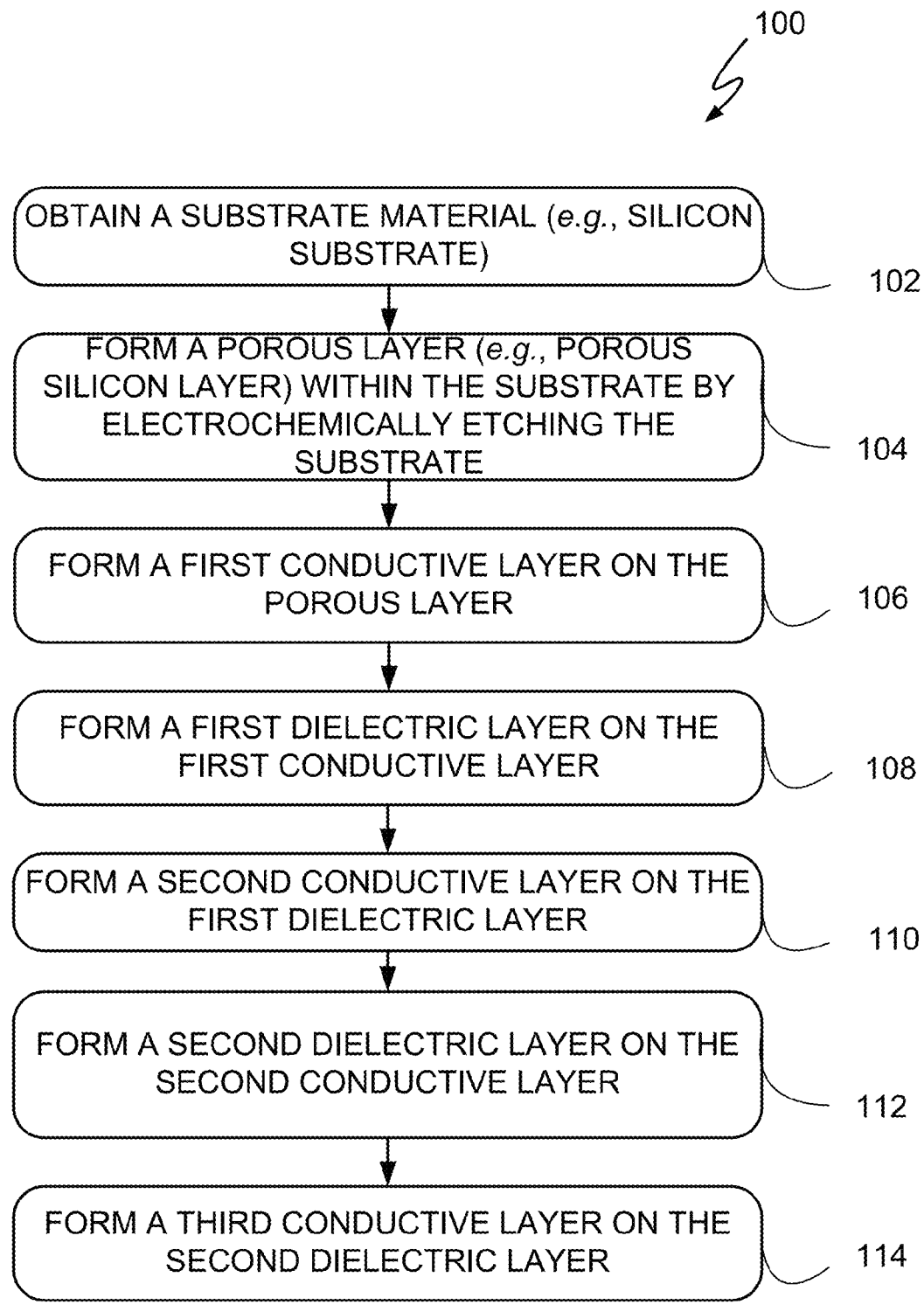
FIG. 1 is a flow diagram representing a method for fabricating an energy storage device (e.g., capacitor) with porous silicon according to an embodiment of the present invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

DETAILED DESCRIPTION

In one embodiment, an energy storage device (e.g., capacitor) may include a porous silicon layer formed within a substrate. The porous silicon layer includes pores with a mean pore diameter less than approximately 100 nanometers. A first conductive layer is formed on the porous silicon layer and a first dielectric layer is formed on the first conductive layer. A second conductive layer is formed on the first dielectric layer to form the capacitor.

Capacitors based on small porous or mesoporous silicon, which are fabricated using electrochemical etching, can provide high-frequency decoupling capacitors. Capacitors fabricated with carbonized silicon surfaces provide a lower effective series resistance (ESR) MIM capacitor.

These energy storage devices (e.g., capacitors) can be used on chip for local decoupling of electrical noise, in a 3-D stack for decoupling multiple chips, or in a silicon interposer. Integrated on-chip capacitors are becoming increasing important for power delivery to microprocessors. These energy storage devices help to prevent severe droops in voltages and also help with the voltage conversion and delivery. Capacitors can also provide high power for applications such as turbo modes in microprocessors.

As used herein, the phrase "high-k" refers to materials (e.g., $TiO_2$, $HfO_2$, $ZrO_2$, $VO_x$, $BaSrTiO_x$, $TiNbO_x$, $SrTiO_x$, $Al2O3$) having a dielectric constant, k, greater than that of silicon dioxide, that is, greater than about 4. As used herein, the phrase "giant dielectric constant" refers to materials (e.g., $CaCu_3Ti_4O_{12}$ or CCTO, $(LaSr)_2NiO_4$, $La_{(2-x)}Sr_xNiO_4$, high-k dielectric oxide nanolaminates such as $TiO_2/Al_2O_3$ superlattices) having an ultra high dielectric constant, k, of approximately k=5000 and greater.

Referring now to the drawings, FIG. 1 is a flow diagram representing a method for fabricating an energy storage device (e.g., capacitor) with porous silicon according to an embodiment of the present invention. At block 102, the method 100 may include obtaining a substrate material (e.g., silicon substrate). Obtaining the substrate material may include various forms including, but not limited to, manufacturing the substrate at a manufacturing facility. At block 104, the method 100 may include forming a porous layer (e.g., porous silicon layer) within the substrate by electrochemically etching the substrate with no photolithography. In one embodiment, the porous silicon layer includes pores with a mean pore diameter less than approximately 100 nanometers. The porous silicon layer may be a mesoporous silicon layer having mesopores with a mean pore diameter between approximately 2 nanometers and approximately 50 nanometers. The forming of the pores within the porous layer may be processed by anodic etching such as electrochemical etching or any other process known in the field of forming micron deep pores with nanometer wide diameters. The pores may be tapered in order to more easily fill the ultra high aspect ratio pores with one or more atomic layer depositions.

At block 106, the method 100 may include forming a first conductive layer (e.g., SiC, TiN, etc.) on the porous layer (e.g., porous silicon layer). At block 108, the method 100 may include forming a first dielectric layer (e.g., high-k dielectric layer, ultra high-k dielectric layer) on the first conductive layer. At block 110, the method 100 may include forming a second conductive layer (e.g., atomic layer deposition such as TiN) on the first dielectric layer.

At block 112, the method 100 may include forming a second dielectric layer (e.g., high-k dielectric layer, ultra high-k dielectric layer) on the second conductive layer. At block 114, the method 100 may include forming a third conductive layer (e.g., electroplated metal such as nickel, CVD of doped polysilicon, atomic layer deposition (ALD) of TiN) on the second dielectric layer. The blocks 112 and 114 are optionally performed if additional capacitance is desired. Additional dielectric/conductive layers can be added to form an N layer MIM structure.

In one embodiment, at least one of the conductive layers (e.g., TiN) is formed by atomic layer deposition. Each of the conductive layers may be formed by atomic layer deposition to form a MIM capacitor or a MIMIM capacitor. Alternatively, the first conductive layer may include a silicon carbide (SiC) layer that is formed by carbonization of the porous silicon layer using at least one gas phase treatment. Carbonization is a term for the deposition of a carbon layer by conversion of an organic substance (e.g., methane, silane) into carbon or a carbon-containing residue through pyrolysis or destructive distillation. In another embodiment, the first conductive layer includes a hydrocarbon-terminated silicon layer that is formed by carbonization of the porous silicon layer using at least one gas phase treatment at a temperature less than approximately 650 degrees Celsius.

The first dielectric layer may include a high-k dielectric constant greater than 4 and can be used for high frequency (e.g., 1 Ghz or more, 10 Ghz or more) decoupling applications. At least one of the first and second dielectric layers may include a giant dielectric constant of approximately 5000 or more.

Figure 2A:
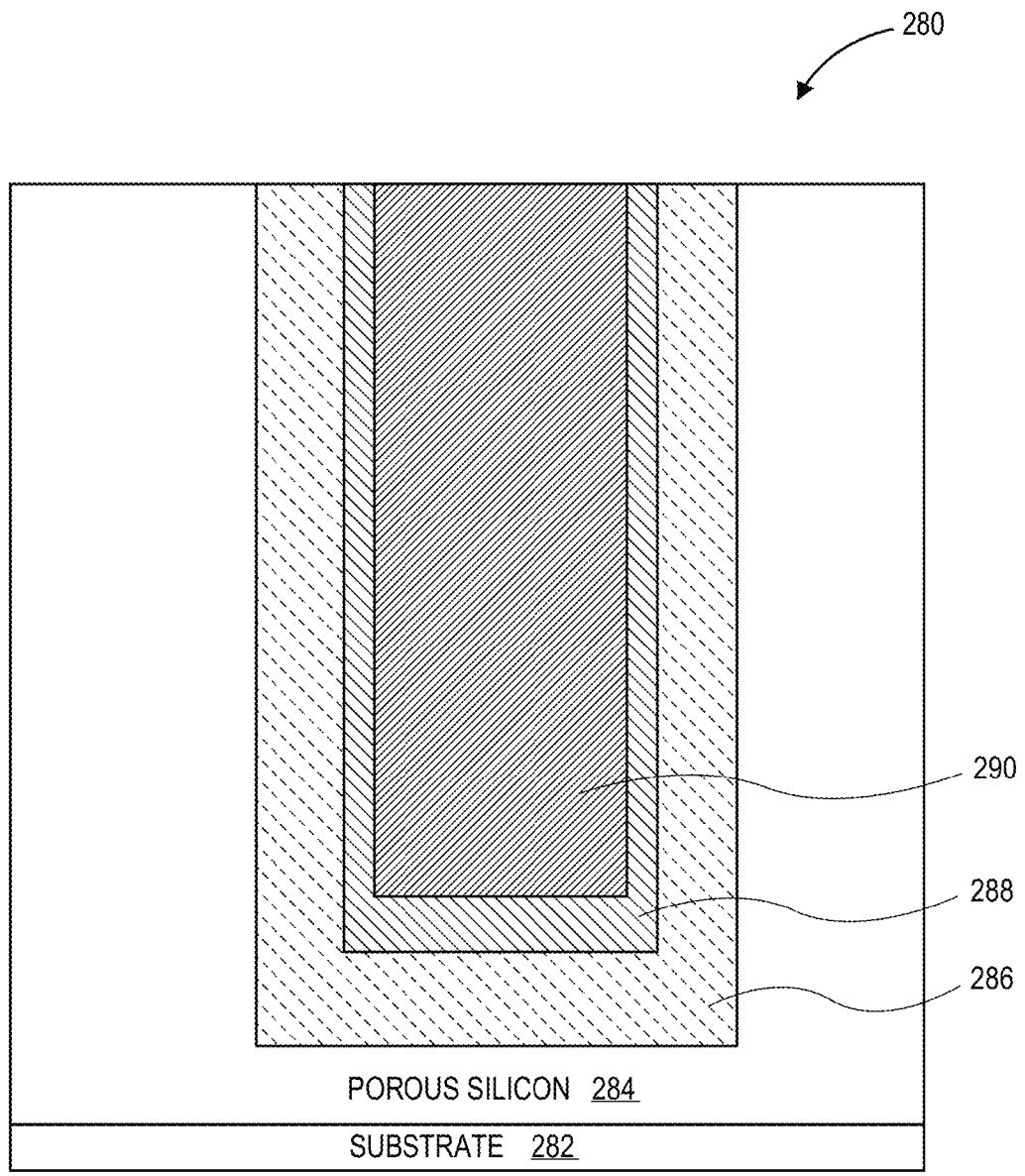
FIG. 2A is a cross-sectional view of a capacitor 280 according to an embodiment of the present invention.

FIG. 2A is a cross-sectional view of a capacitor 280 according to an embodiment of the present invention. Substrate 282 includes porous silicon layer 284 that can be formed within the substrate by electrochemically etching the substrate. In one embodiment, the porous silicon layer 284 includes pores with a mean pore diameter less than approximately 100 nanometers. The porous silicon layer may be a mesoporous silicon layer having mesopores with a mean pore diameter between approximately 2 nanometers and approximately 50 nanometers. A first conductive layer 286 (e.g., SiC, TiN, etc.) is formed on the porous silicon layer. In one embodiment, the first conductive layer 286 (e.g., TiN) is formed by atomic layer deposition. Alternatively, the first conductive layer 286 may include a silicon carbide (SiC) layer that is formed by carbonization of the porous silicon layer using at least one gas phase treatment. The SiC layer is a highly stable surface. In another embodiment, the first conductive layer includes a hydrocarbon-terminated silicon layer that is formed by carbonization of the porous silicon layer using at least one gas phase treatment at a temperature less than approximately 650 degrees Celsius. The hydrocarbon-terminated porous silicon surface can be used as a conductive electrode or the porous silicon layer can be functionalized and then used as a conductive electrode. The porous silicon layer may have radicals that may react with a subsequent layer such as a dielectric layer. The porous silicon layer is functionalized to prepare the surface for a subsequent layer. Silylated or derivatized porous Si can also be formed using liquid phase treatments.

A first dielectric layer 288 (e.g., high-k dielectric layer, ultra high-k dielectric layer) is formed on the first conductive layer. A second conductive layer 290 (e.g., electroplated metal such as Nickel, CVD of doped polysilicon, ALD of TiN) is formed on the first dielectric layer. Thus, a MIM or metal-insulator-semiconductor (MIS) capacitor 280 is formed.

Figure 4A:
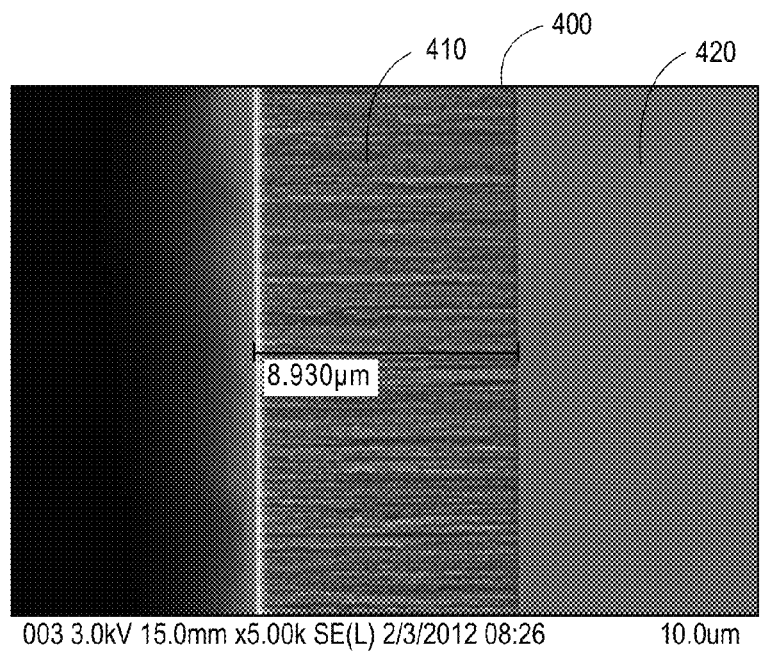
FIG. 4A illustrates a scanning electron microscope (SEM) image 400 showing a tapered structure 400 having a substrate 420 with a porous silicon region 410 according to an embodiment of the invention.
Figure 4B:
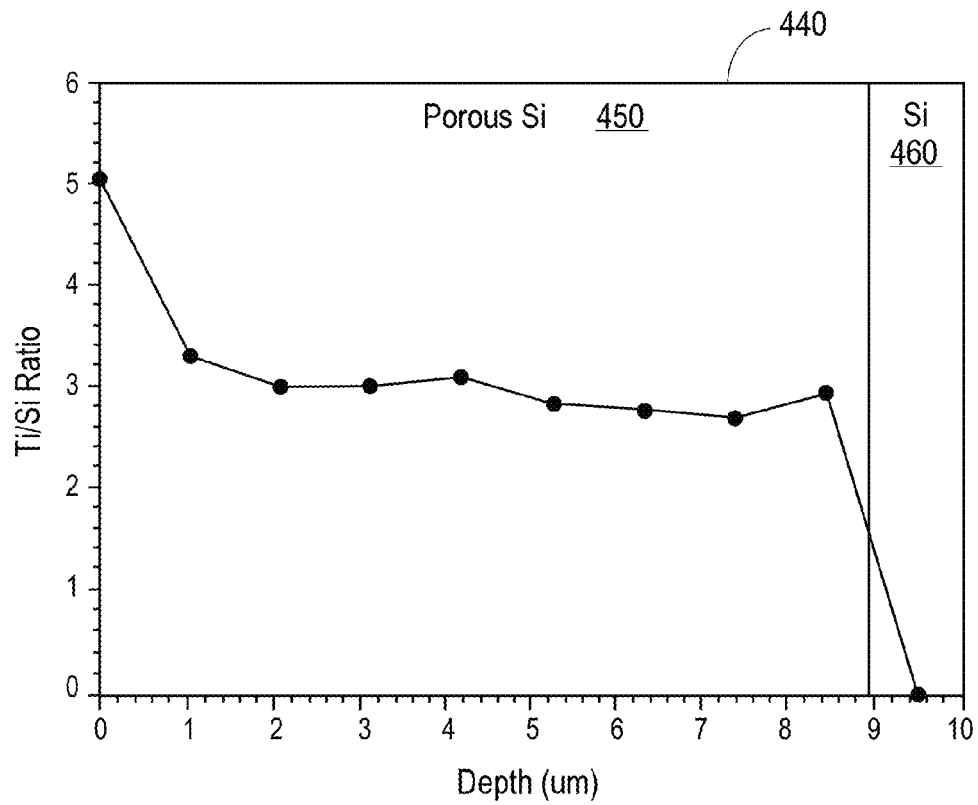
FIG. 4B illustrates a graph 440 of Ti/Si ratio versus depth of porous silicon 450 in accordance with one embodiment of the present invention.

In an embodiment, a target for leakage currents of a capacitor are less than $10^5$ A/cm$^2$ which would require a dielectric layer thickness in the range of 5-20 nm and then at least 10 nm to complete filling for the top conductive layer. This would require electrochemically etching pores with a minimum diameter of approximately 30-50 nm. To fill the ultra high aspect ratios, tapered pores have been used to improve the ALD as illustrated in FIG. 4A and stop-flow atomic layer deposition has been successfully demonstrated as illustrated in FIG. 4B.

Figure 2B:
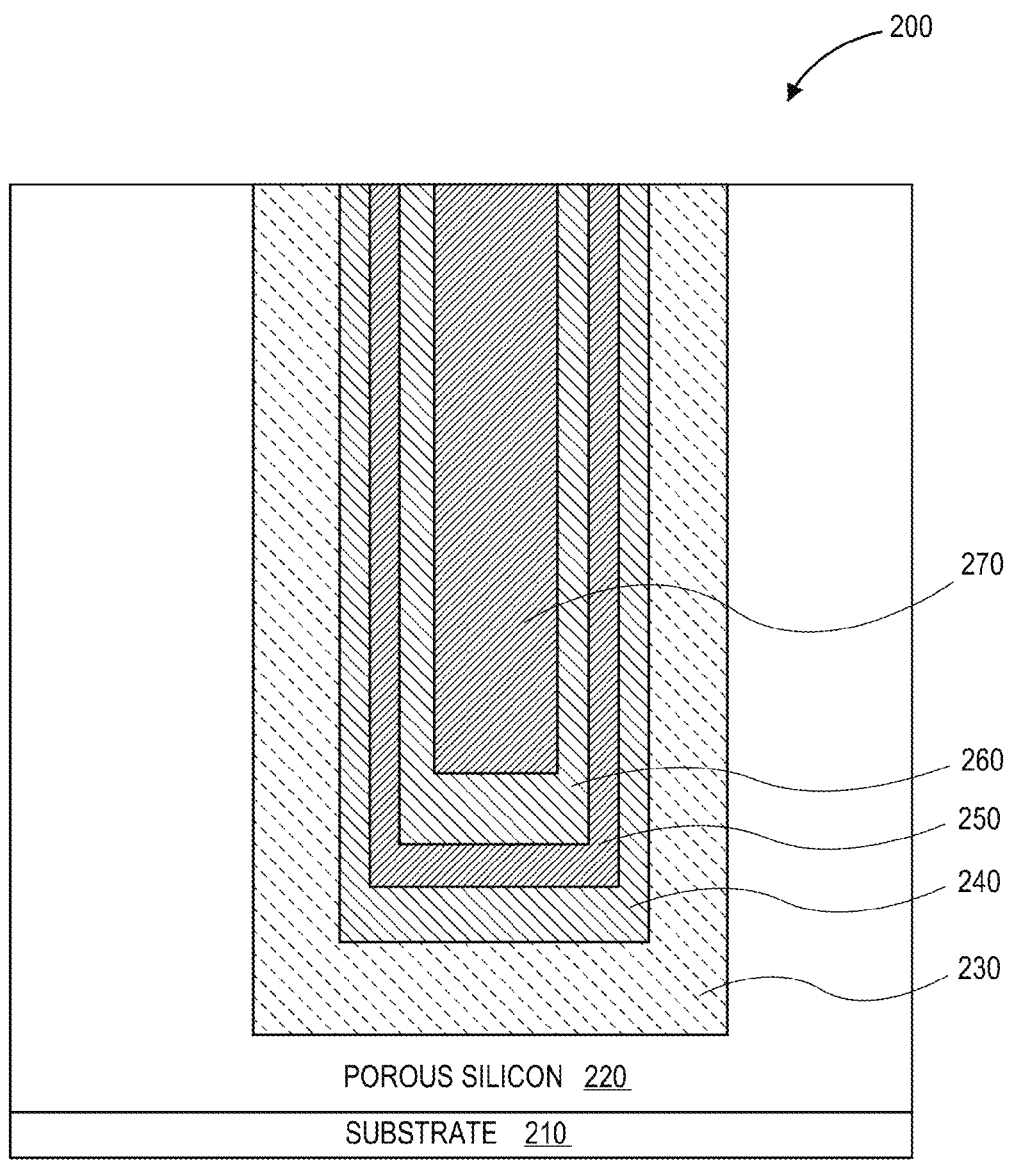
FIG. 2B is a cross-sectional view of a capacitor 200 according to an embodiment of the present invention.

FIG. 2B is a cross-sectional view of a capacitor 200 according to an embodiment of the present invention. Substrate 210 includes porous silicon layer 220 that can be formed within the substrate by electrochemically etching the substrate. In one embodiment, the porous silicon layer 220 includes pores with a mean pore diameter less than approximately 100 nanometers. The porous silicon layer may be a mesoporous silicon layer having mesopores with a mean pore diameter between approximately 2 nanometers and approximately 50 nanometers. A first conductive layer 230 (e.g., SiC, TiN, etc.) is formed on the porous silicon layer 220. In one embodiment, the first conductive layer 230 (e.g., TiN) is formed by atomic layer deposition. Alternatively, the first conductive layer 230 may include a silicon carbide (SiC) layer that is formed by carbonization of the porous silicon layer using at least one gas phase treatment. In another embodiment, the first conductive layer includes a hydrocarbon-terminated silicon layer that is formed by carbonization of the porous silicon layer using at least one gas phase treatment at a temperature less than approximately 650 degrees Celsius.

A first dielectric layer 240 (e.g., high-k dielectric layer, ultra high-k dielectric layer) is formed on the first conductive layer 230. A second conductive layer 250 (e.g., electroplated metal such as Nickel, CVD of doped polysilicon, ALD of TiN) is formed on the first dielectric layer. A second dielectric layer 260 (e.g., high-k dielectric layer, ultra high-k dielectric layer) may be formed on the second conductive layer. A third conductive layer 270 (e.g., electroplated metal such as Nickel, CVD of doped polysilicon, ALD of TiN) may be formed on the second dielectric layer. The layers 260 and 270 are optionally added if additional capacitance is desired. Thus, a MIMIM or MIMIS capacitor 200 is formed.

In one embodiment, a capacitor includes one or more high-k dielectric layers that can be used for high frequency (e.g., one or more Ghz, ten or more Ghz) decoupling applications. In another embodiment, the capacitor includes one or more giant dielectric constant layers, which have a dielectric constant k of approximately 5000 or greater for lower frequency (e.g., up to approximately 10 kilohertz) energy storage applications.

Smaller deep porous (e.g., 30-100 nm mean pore diameters) silicon can be formed electrochemically with much higher aspect ratios than can be obtained with prior approaches such as lithography and dry etching. Pore tapering can be electrochemically formed to improve the sidewall coverage. Atomic layer deposition (ALD) is used to deposit the high-k dielectrics in ultrahigh aspect ratio structures (e.g., aspect ratio greater than 10,000) for the high-frequency MIS or MIM capacitors.

Carbonization can be used to treat the surface of the pore openings in the silicon to produce a stable conductive surface. ALD can be used to deposit the top and or bottom conductive layers of the MIM structure. Alternatively, electrodeposition can be used to deposit the top electrode.

FIG. 3A illustrates a scanning electron microscope (SEM) image 300 showing a structure with tapered pore openings formed in tapered porous silicon according to an embodiment of the invention. A MIMIM capacitor can be formed on the surfaces of the silicon pores in image 300 and may include either carbonized silicon or TiN as the first electrode and ALD films for the high-k dielectrics and conductors except for the final conductor, which is an electroplated conductor. FIGS. 3B-3D illustrate SEM images 312, 322, and 332 showing magnified views of different regions of the image 300 in porous silicon according to an embodiment of the invention. Image 312 shows an upper region of porous silicon. Image 322 shows an interior region of porous silicon. Image 332 shows a lower region of porous silicon near an interface with a substrate.

FIG. 4A illustrates a scanning electron microscope (SEM) image 400 showing a tapered structure having a substrate 420 with a porous silicon region 410 according to an embodiment of the invention. The porous silicon region 410 includes tapered pores. The tapering allows for process gases to penetrate into the pores or channels during fabrication of a capacitor.

FIG. 4B illustrates a graph 440 of Ti/Si ratio versus depth of porous silicon 450 in accordance with one embodiment of the present invention. TiN has been deposited in the tapered porous silicon 450. The Ti/Si ratio is relatively constant through the porous silicon 450. The porous silicon 450 has a depth of approximately 9 microns.

With the right etchant, it should be possible to make porous structures having the described characteristics from a wide variety of materials, especially semiconducting materials such as germanium, SiGe, and GaAs as well as materials such as alumina. As an example, a porous silicon structure may be created by etching a silicon substrate with a mixture of hydrofluoric acid (HF) and alcohol (ethanol, methanol, isopropyl, etc.). More generally, porous silicon and other porous structures may be formed by such processes as anodization and stain etching.

In certain embodiments, the pores have a mean diameter of less than 100 nm and a depth of approximately 10 microns. This upper size limit for the diameter of the pores may be chosen for particular embodiments in order to maximize the surface area of the porous structures of those embodiments. Smaller (e.g., narrower) pores lead to increased overall surface area for each electrically conductive structure because a larger number of such narrower pores can fit into an electrically conductive structure of a given size. Because capacitance is proportional to surface area, pores constrained in size in the manner described would likely, and advantageously, result in capacitors with increased capacitance. (The pores' other dimensions, e.g., their lengths, may also be manipulated in order to increase surface area (or to achieve some other result)—i.e., longer channels may be preferred over shorter ones—but otherwise are likely to be less critical than the smallest dimension discussed above.)

Figure 5:
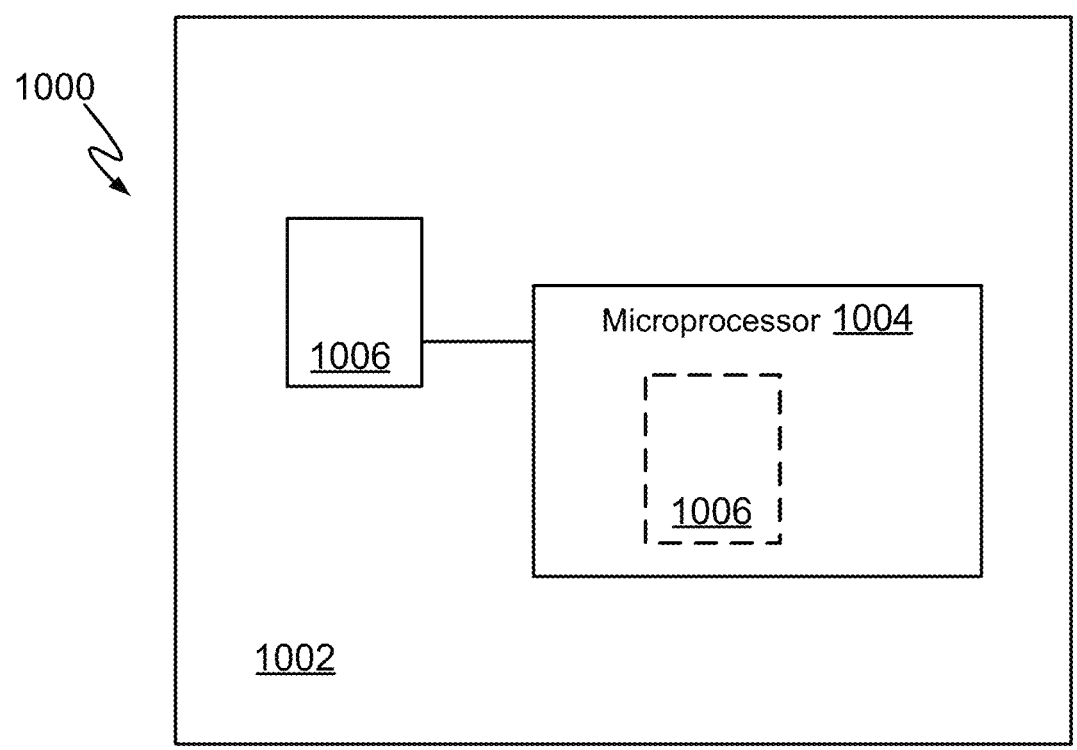
FIG. 5 is a block diagram representing a microelectronic device according to an embodiment of the present invention.

FIG. 5 is a block diagram representing a microelectronic device 1000 according to an embodiment of the invention. As illustrated in FIG. 5, microelectronic device 1000 may include a substrate 1002, a microprocessor 1004 over substrate 1002, and an energy storage device (e.g., capacitor) 1006 associated with microprocessor 1004. Energy storage device (e.g., capacitor) 1006 can either be located on substrate 1002 away from microprocessor 1004 (e.g., a die-side capacitor), as illustrated in solid lines, or it can be located on microprocessor 1004 itself (e.g., in a build-up layer above the microprocessor), as illustrated in dashed lines. In one embodiment, energy storage device (e.g., capacitor) 1006 includes a porous silicon layer formed within the substrate. The porous silicon layer includes pores with a mean pore diameter less than 100 nanometers. A first conductive layer is formed on the porous silicon layer and a first dielectric layer is formed on the first conductive layer. A second conductive layer is formed on the first dielectric layer. A second dielectric layer may be formed on the second conductive layer and a third conductive layer may be formed on the second dielectric layer. The energy storage device can provide power to the microprocessor.

The first conductive layer may include a silicon carbide layer that is formed by carbonization of the porous silicon layer using at least one gas phase treatment. Alternatively, the first conductive layer may include a hydrocarbon-terminated silicon layer that is formed by carbonization of the porous silicon layer using at least one gas phase treatment at a temperature less than approximately 650 degrees Celsius. Alternatively, the first conductive layer may be TiN deposited using ALD.

In an embodiment, at least one of the first and second dielectric layers includes a giant dielectric constant k, which can be used for lower frequency (e.g., up to approximately 10 kilohertz) energy storage applications. At higher frequencies, the giant dielectric constant k values typically decrease rapidly. In another embodiment, the first dielectric layer includes a high-k dielectric constant greater than 4 that can be used for high frequency (e.g., one or more Ghz, ten or more Ghz) decoupling applications. The energy storage device can prevent voltage droops in a power supply. The porous silicon layer can be formed within the substrate by electrochemically etching the substrate to form tapered pores.

As an example, this embodiment can be similar to one or more of the embodiments shown in the figures and described in the accompanying text. Energy storage device 1006 may include nanostructures (e.g., discrete nanostructures).

In another embodiment, an energy storage device may include a porous silicon layer formed within a substrate. The porous silicon layer includes pores with a mean pore diameter less than approximately 100 nanometers. A dielectric layer is formed on the porous silicon layer and a conductive layer is formed on the first dielectric layer. The porous silicon layer may be doped (e.g., heavily doped to make resistivity low) to form a first electrode while the conductive layer forms a second electrode of a MIS capacitor. The energy storage device may optionally include another dielectric layer formed on the conductive layer and another conductive layer formed on the additional dielectric layer to form a MIMIS capacitor.

The energy storage devices disclosed herein may in some embodiments be used as a decoupling capacitor within microelectronic device 1000—one that is smaller and that, for the reasons described elsewhere herein, offers much higher capacitance and much lower impedance than existing decoupling capacitors. As already mentioned, energy storage device 1006 can be part of a support integrated circuit (IC) or chip or it can be located on the microprocessor die itself. As an example, one might, according to embodiments of the invention, be able to form regions of porous silicon (or the like, as described above) on a microprocessor die and then create a high-surface-area embedded decoupling capacitor right on the substrate of the microprocessor die. Because of the porosity of the silicon, the embedded capacitor would have very high surface area. Other possible uses for the disclosed energy storage devices include use as a memory storage element (where problems with the z-direction size of embedded DRAM approaches may be solved by greatly increasing the farads per unit area) or as a component of voltage converters in voltage boost circuitry, perhaps for use with circuit blocks, individual microprocessor cores, or the like.

As an example, higher capacitance values could in this context be advantageous because parts of the circuit could then run nominally at a certain (relatively low) voltage but then in places where higher voltage is needed in order to increase speed (e.g., cache memory, input/output (I/O) applications) the voltage could be boosted to a higher value. An operational scheme of this sort would likely be preferred over one in which the higher voltage is used everywhere; i.e., in cases where only a small amount of circuitry requires a higher voltage it likely would be preferable to boost voltage from a lower baseline voltage for that small portion of the circuit rather than drop voltage from a higher baseline value for the majority of the circuitry. Future microprocessor generations may also make use of voltage converters of the type described here. Having more capacitance available to be deployed around a package or around a microprocessor die may help solve the existing issue of intolerably high inductance of typical decoupling capacitors.

Figure 6:
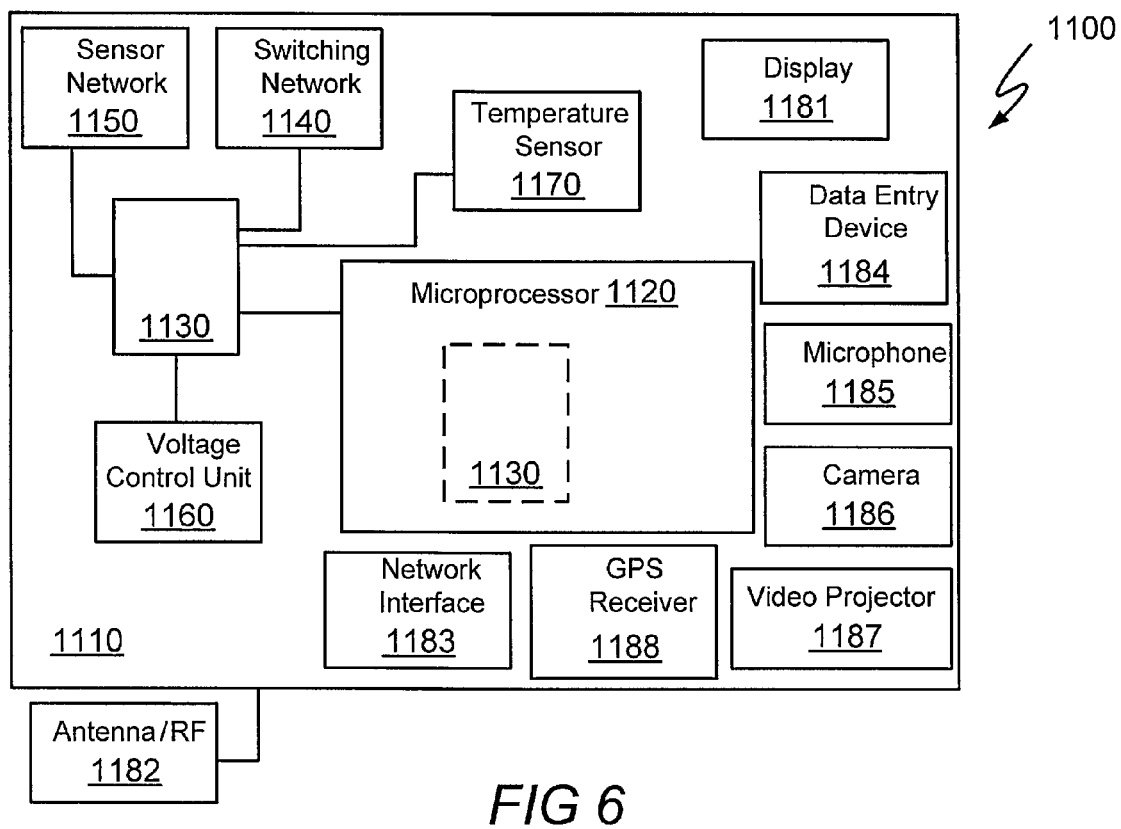
FIG. 6 is a block diagram representing a mobile electronic device according to an embodiment of the present invention.

FIG. 6 is a block diagram representing a mobile electronic device 1100 according to an embodiment of the invention. As illustrated in FIG. 6, mobile electronic device 1100 includes a substrate 1110 on which a microprocessor 1120 and an energy storage device 1130 associated with microprocessor 1120 are disposed. Energy storage device 1130 can either be located on substrate 1110 away from microprocessor 1120, as illustrated in solid lines, or it can be located on microprocessor 1120 itself, as illustrated in dashed lines. In one embodiment, energy storage device 1130 includes a porous silicon layer formed within the substrate. The porous silicon layer includes pores with a mean pore diameter less than 100 nanometers. A first conductive layer is formed on the porous silicon layer and a first dielectric layer is formed on the first conductive layer. A second conductive layer is formed on the first dielectric layer. A second dielectric layer may be formed on the second conductive layer and a third conductive layer may be formed on the second dielectric layer. As an example, this embodiment can be similar to one or more of the embodiments shown and described herein.

In at least some embodiments energy storage device 1130 is one of a plurality of energy storage devices (all of which are represented in FIG. 6 by block 1130) contained within mobile electronic device 1100. In one or more of those embodiments, mobile electronic device 1100 further includes a switching network 1140 associated with the energy storage devices. When a capacitor is being discharged, it doesn't maintain a constant voltage, but instead decays in an exponential manner (unlike a battery where the voltage stays relatively constant during discharge). Switching network 1140 includes circuitry or some other mechanism that switches in and out various capacitors such that a relatively constant voltage is maintained. For example, the energy storage devices could initially be connected to each other in parallel and then, after a certain amount of voltage decay, a subset of the energy storage devices could be changed by the switching network so as to be connected in series such that their individual voltage contributions can boost the declining overall voltage. In one embodiment switching network 1140 could be implemented using existing silicon device technology as used in the art (transistors, silicon controlled rectifiers (SCRs), etc.), while in other embodiments it could be implemented using micro-electro-mechanical systems (MEMS) relays or switches (which, it may be noted, tend to have very low resistance). In some embodiments, mobile electronic device 1100 further includes a sensor network 1150 associated with energy storage device 1130. In at least some embodiments each one of the plurality of energy storage devices will have its own sensor that indicates certain behavioral parameters of the energy storage device. For example, the sensors may indicate existing voltage levels as well as the ongoing discharge response, both of which are parameters that may be used by the switching network—especially in cases where the dielectric material (or other electrical insulator) being used is not linear but rather has a dielectric constant that varies with the voltage. In those cases, it may be advantageous to include along with the sensor network a finite state machine such as a voltage control unit 1160 that knows what the behavior of the dielectric is and responds accordingly. A voltage control unit that knows how the dielectric behaves can compensate for any non-linearity. A temperature sensor 1170 associated with energy storage devices 1130 may also be included in order to sense temperature (or other safety-related parameters). In certain embodiments of the invention, mobile electronic device 1100 further includes one or more of: a display 1181, antenna/RF elements 1182, a network interface 1183, a data entry device 1184 (e.g., a keypad or a touchscreen), a microphone 1185, a camera 1186, a video projector 1187, a global positioning system (GPS) receiver 1188, and the like. In one embodiment, a device (e.g., microelectronic device, mobile electronic device) includes a substrate, a microprocessor over the substrate, and an energy storage device associated with the microprocessor. The energy storage device includes a porous silicon layer formed within the substrate. The porous silicon layer includes pores with a mean pore diameter less than approximately 100 nanometers. A first conductive layer is formed on the porous silicon layer. A first dielectric layer is formed on the first conductive layer and a second conductive layer is formed on the first dielectric layer. The device may further include a second dielectric layer that is formed on the second conductive layer and a third conductive layer that is formed on the second dielectric layer. The energy storage device can provide power to the microprocessor. The porous silicon layer may include pores with a mean pore diameter less than 50 nanometers. The porous silicon layer is formed within the substrate by electrochemically etching the substrate to form tapered pores. The energy storage device is designed to prevent voltage droops in a power supply.

The first conductive layer may include a silicon carbide layer or a silicon layer that is coated by a layer of carbon. The layer is formed by carbonization of the porous silicon layer using at least one gas phase treatment. The first conductive layer may include a hydrocarbon-terminated silicon layer that is formed by carbonization of the porous silicon layer using at least one gas phase treatment at a temperature less than approximately 650 degrees Celsius.

In one embodiment, the first dielectric layer may include a high-k dielectric constant that is greater than 4 that can be used for high frequency (e.g., one or more Ghz, ten or more Ghz) decoupling applications. In another embodiment, at least one of the first and second dielectric layers includes a giant dielectric constant of approximately 5000 or greater.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy storage devices and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An energy storage device, comprising:
   a mesoporous silicon layer formed within a substrate by electrochemically etching the substrate with no photolithography, the mesoporous silicon layer having pores with tapered pore openings and with a mean pore diameter of approximately 50 nanometers or less;
   a first conductive layer formed on the mesoporous silicon layer;
   a first dielectric layer formed on the first conductive layer; and
   a second conductive layer formed on the first dielectric layer.

2. The energy storage device of claim 1, further comprising:
   a second dielectric layer formed on the second conductive layer; and
   a third conductive layer formed on the second dielectric layer.

3. The energy storage device of claim 2, wherein at least one of the first and second dielectric layers includes a giant dielectric constant of approximately 5000 or greater.

4. The energy storage device of claim 1, wherein at least one of the first conductive layer, the first dielectric layer, and the second conductive layer is formed by atomic layer deposition.

5. The energy storage device of claim 1, wherein the first conductive layer includes a silicon carbide layer or a silicon layer coated by a layer of carbon that is formed by carbonization of the mesoporous silicon layer using at least one gas phase treatment.

6. The energy storage device of claim 1, wherein the first conductive layer includes a hydrocarbon-terminated silicon layer that is formed by carbonization of the mesoporous silicon layer using at least one gas phase treatment at a temperature less than approximately 650 degrees Celsius.

7. The energy storage device of claim 1, wherein the first dielectric layer includes a high-k dielectric constant greater than 4 that can be used for high frequency decoupling applications of one or more Ghz.

8. The energy storage device of claim 1, wherein the mesoporous silicon layer includes pores with a mean pore diameter between approximately 50 nanometers and approximately 2 nanometers.

9. The energy storage device of claim 1, wherein the mesoporous silicon layer includes pores with a mean pore depth of approximately 10 microns.

10. The energy storage device of claim 1, wherein the mesoporous silicon layer is formed within the substrate by electrochemically etching the substrate to form tapered pores.

11. A device, comprising:
    a substrate;
    a microprocessor over the substrate; and
    an energy storage device associated with the microprocessor, the energy storage device comprises a mesoporous silicon layer formed within the substrate by electrochemically etching the substrate with no photolithography, the mesoporous silicon layer having pores with tapered pore openings and with a mean pore diameter of approximately 50 nanometers or less;
a first conductive layer formed on the mesoporous silicon layer;
a first dielectric layer formed on the first conductive layer; and
a second conductive layer formed on the first dielectric layer.

12. The device of claim 11, further comprising:
a second dielectric layer formed on the second conductive layer; and
a third conductive layer formed on the second dielectric layer.

13. The device of claim 12, wherein at least one of the first and second dielectric layers includes a giant dielectric constant of approximately 5000 or greater.

14. The device of claim 11, wherein the energy storage device provides power to the microprocessor.

15. The device of claim 11, wherein the first conductive layer includes a silicon carbide layer or a silicon layer coated by a layer of carbon that is formed by carbonization of the mesoporous silicon layer using at least one gas phase treatment.

16. The device of claim 11, wherein the first conductive layer includes a hydrocarbon-terminated silicon layer that is formed by carbonization of the mesoporous silicon layer using at least one gas phase treatment at a temperature less than approximately 650 degrees Celsius, wherein the first dielectric layer includes a high-k dielectric constant greater than 4 and allows the energy storage device to be used for high frequency decoupling applications.

17. The device of claim 11, wherein the mesoporous silicon layer includes pores with a mean pore diameter less than 50 nanometers, wherein the energy storage device acts to prevent voltage droops in a power supply, wherein the mesoporous silicon layer is formed within the substrate by electrochemically etching the substrate to form tapered pores.

18. An energy storage device, comprising:
a mesoporous silicon layer formed within a substrate by electrochemically etching the substrate with no photolithography, the mesoporous silicon layer having pores with tapered pore openings and with a mean pore diameter of approximately 50 nanometers or less;
a dielectric layer formed on the mesoporous silicon layer; and
a conductive layer formed on the dielectric layer.

19. The energy storage device of claim 18, further comprising:
an additional dielectric layer formed on the conductive layer; and
an additional conductive layer formed on the additional dielectric layer.

20. The energy storage device of claim 18, wherein the mesoporous silicon layer is doped to form a first electrode while the conductive layer forms a second electrode.

* * * * *